United States Patent [19]

Wiemers et al.

[11] Patent Number: 5,563,523
[45] Date of Patent: Oct. 8, 1996

[54] CIRCUIT CONFIGURATION FOR PREPARING ANALOG SIGNALS FOR A BOUNDARY SCAN TEST PROCESS

[75] Inventors: Thomas Wiemers, Wuppertal; Johannes van den Boom, Düsseldorf, both of Germany

[73] Assignee: Siemens Aktiengesellschaft, Munich, Germany

[21] Appl. No.: 369,181

[22] Filed: Jan. 5, 1995

[30] Foreign Application Priority Data

Jan. 5, 1994 [DE] Germany ............... 44 00 194.0

[51] Int. Cl.$^6$ .................................................. G01R 31/28
[52] U.S. Cl. .................... 324/763; 371/22.1; 364/483
[58] Field of Search .................... 324/77, 763; 371/22.3, 371/29; 364/483

[56] References Cited

U.S. PATENT DOCUMENTS 3,891,920  1/1975  Williams ............................ 324/77
4,630,270  12/1986  Petit et al. ............................ 371/29

FOREIGN PATENT DOCUMENTS 4210108  9/1993  Germany.
4213905  11/1993  Germany.

OTHER PUBLICATIONS

Publication: Elrad, 3-92, pp. 36-41, "Im Testen was Neues", 1992 (month unavailable).

Primary Examiner—Kenneth A. Wieder
Assistant Examiner—Barry C. Bowser
Attorney, Agent, or Firm—Herbert L. Lerner; Laurence A. Greenberg

[57] ABSTRACT

A circuit configuration for preparing analog signals for a boundary scan test process includes a boundary cell input structure. A Schmitt trigger receives an analog signal and has an output connected to the boundary cell input structure.

2 Claims, 1 Drawing Sheet

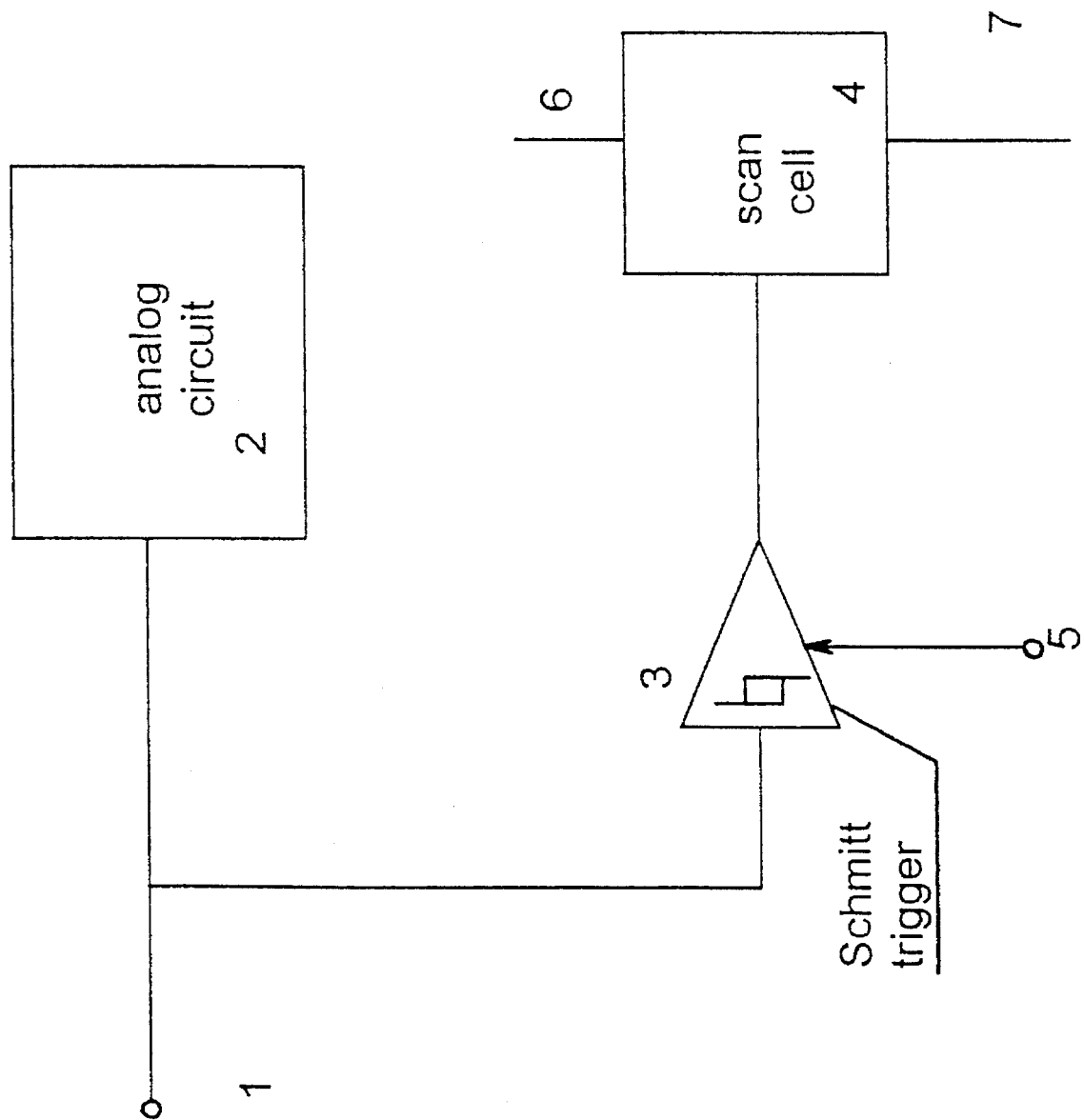

CIRCUIT CONFIGURATION FOR PREPARING ANALOG SIGNALS FOR A BOUNDARY SCAN TEST PROCESS

BACKGROUND OF THE INVENTION

Field of the Invention

The invention relates to a circuit configuration for preparing analog signals for a boundary scan test process.

The mode of operation of a boundary scan is described in further detail, for instance, in Elrad, 3-92, pp. 36-41. The boundary scan has become the standard system for testing integrated circuits as well as complex systems.

The disadvantage of the boundary scan is that it can be used only with digital systems. Analog signals cannot be detected by the boundary scan test.

However, even in digital signals, it is increasingly necessary to test analog signals which are produced, for instance by A/D converters, D/A converters or reference voltages.

SUMMARY OF THE INVENTION

It is accordingly an object of the invention to provide a circuit configuration for preparing analog signals for a boundary scan test process, which overcomes the hereinafore-mentioned disadvantages of the heretofore-known devices of this general type and which is simple.

With the foregoing and other objects in view there is provided, in accordance with the invention, a circuit configuration for preparing analog signals for a boundary scan test process, comprising a boundary cell input structure, and a Schmitt trigger receiving an analog signal and having an output connected to the boundary cell input structure.

In accordance with a concomitant feature of the invention, there are provided means for turning off the Schmitt trigger.

Other features which are considered as characteristic for the invention are set forth in the appended claims.

Although the invention is illustrated and described herein as embodied in a circuit configuration for preparing analog signals for a boundary scan test process, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

BRIEF DESCRIPTION OF THE DRAWING

The FIGURE of the drawing is a schematic diagram of a circuit configuration according to the invention.

DESCRIPTION OF THE PREFERRED EMBODIMENTS

Referring now to the single FIGURE of the drawing in detail, it is seen that reference numeral 1 indicates an externally accessible input or output terminal of an integrated circuit, or an internal terminal. This terminal is connected to an analog circuit 2. A Schmitt trigger 3 is provided with an input that is connected to the terminal 1. The Schmitt trigger is constructed to be controllable, so that it can be activated or deactivated through a control terminal and a terminal 5 associated with the control terminal. An output of the Schmitt trigger 3 is connected to a standard boundary scan cell 4. This cell 4 has a boundary scan input 7 and a boundary scan output 6.

It is assumed for discussion that an analog signal is being carried from or to the terminal 1. For this analog signal to be observable, it is converted by the Schmitt trigger 3 into a simple logical signal. To that end, the Schmitt trigger 3 is activated through the terminal 5. The digital signal that can be picked up at the output of the Schmitt trigger 3 can then be incorporated into the boundary scan test by the boundary scan cell 4 which may be standard.

During normal operation of the component, the Schmitt trigger can be deactivated through the terminal 5, so that no quadrature-axis current components will be created in the Schmitt trigger 3. A switching point can be determined through the use of the Schmitt trigger 3 connected to the boundary scan cell 4.

Admittedly, the correctness of the analog signals cannot be checked through the use of the configuration of the invention. However, and this is quite important in many cases, a connecting test of the signal-carrying analog line can be carried out, and moreover a check can be made as to whether or not a reference voltage is turned on.

We claim:

1. A circuit configuration for preparing analog signals for a boundary scan test process, comprising a boundary scan cell having a boundary scan cell input and a boundary scan cell output, and a Schmitt trigger receiving an analog signal and having an output connected to said boundary scan cell input of said boundary scan cell.

2. The circuit configuration according to claim 1, including means for turning off said Schmitt trigger.

* * * * *